(12) United States Patent
Ning

(10) Patent No.: US 6,451,667 B1
(45) Date of Patent: Sep. 17, 2002

(54) SELF-ALIGNED DOUBLE-SIDED VERTICAL MIMCAP

(75) Inventor: Xian J. Ning, Mohegan Lake, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/742,918

(22) Filed: Dec. 21, 2000

(51) Int. Cl.[7] .............................................. H01L 21/20
(52) U.S. Cl. ...................... 438/397; 438/379; 438/240; 438/253; 438/254; 257/267; 257/306; 257/758
(58) Field of Search ................................. 438/397, 379, 438/253, 240, 254; 257/758, 267, 306

(56) References Cited

U.S. PATENT DOCUMENTS 5,654,581 A  8/1997  Radosevich et al. ........ 257/534

OTHER PUBLICATIONS

Ruichen Liu, et al., Single Mask Metal–Insulator–Metal (MIM) Capacitor with Copper Damascene Metallization for Sub–0.18 μm Mixed Mode Signal and System–on–a–Chip (SoC) Applications; Proc. 2000 IITC pp. 111–113 (2000).

R. Mahnkopf, et al., "System on a Chip" Technology Platform for 0.18 μm Digital, Mixed Signal & eDRAM Applications; Digest 1999 IEDM pp. 849–852 (1999).

M. Armacost, et al., A High Reliability Metal Insulator Metal Capacitor for 0.18 μm Copper Technology; Digest 2000 IEDM (2000, in press).

*Primary Examiner*—Richard Elms
*Assistant Examiner*—Pho M. Luu
(74) *Attorney, Agent, or Firm*—Slater & Matsil, LLP

(57) ABSTRACT

A vertical MIM capacitor (140) including a first conductive line (124) and second conductive line (136) sandwiched around a vertical portion of a capacitor dielectric (134). Additional conductive lines (136) may be positioned vertically proximate first conductive lines (124) separated by another vertical portion of capacitor dielectric (134) to form a double-sided capacitor (142), increasing the capacitance. A plurality of vertical MIMcaps (140, 142) may be coupled together in parallel to increase the capacitance.

35 Claims, 5 Drawing Sheets

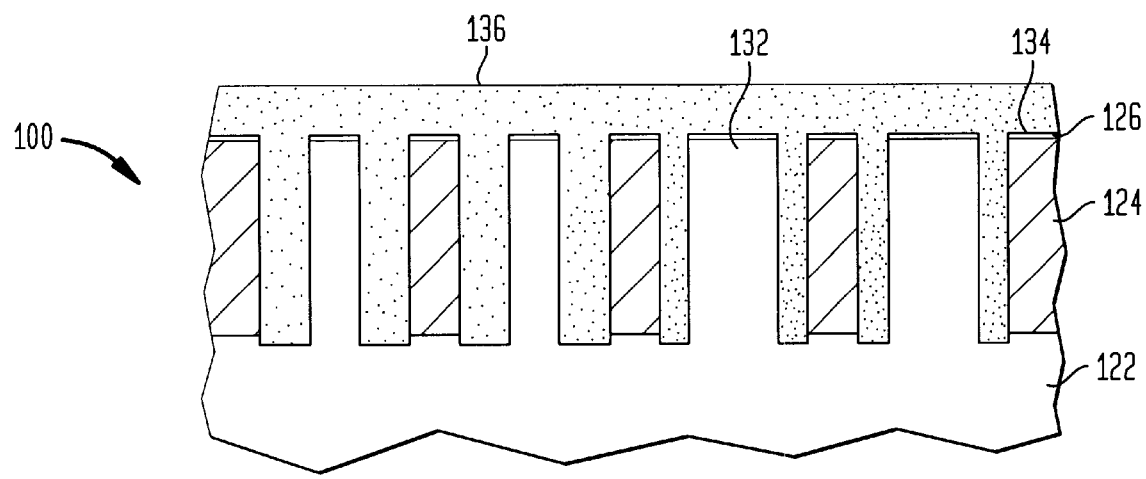
FIG. 5
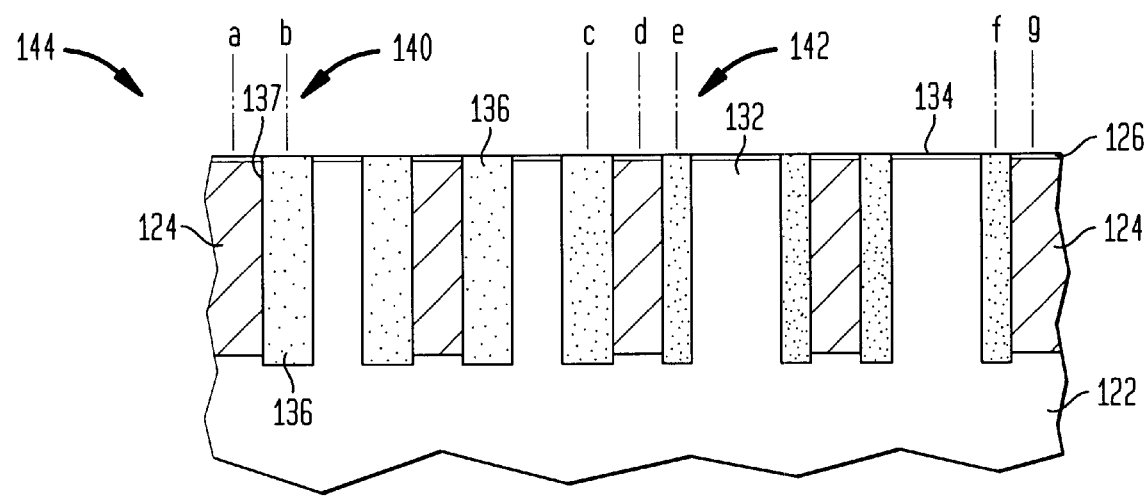
FIG. 6
FIG. 7
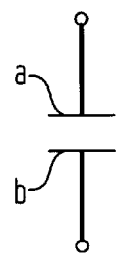
FIG. 8
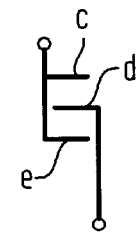

SELF-ALIGNED DOUBLE-SIDED VERTICAL MIMCAP

TECHNICAL FIELD

The present invention relates generally to the fabrication of semiconductor devices, and more particularly to metal-insulator-metal (MIM) capacitors.

BACKGROUND OF THE INVENTION

Semiconductors are widely used for integrated circuits for electronic applications, including radios, televisions and personal computing devices, as examples. Such integrated circuits typically include multiple transistors fabricated in single crystal silicon. It is common for there to be millions of semiconductor devices on a single semiconductor product. Many integrated circuits now include multiple levels of metallization for interconnections.

The manufacturing process flow for semiconductors is generally referred to in two time periods: front-end-of-line (FEOL) and back-end-of-line (BEOL). Higher temperature processes are performed in the FEOL, during which impurity implantation, diffusion and formation of active components such as transistors occurs. Lower temperature processes take place in the BEOL, which generally starts when the first metallization layer is formed. There is a defined thermal budget during the BEOL to prevent diffusion of metal into dielectric, and avoid flowing of the metal lines, which can cause voids and result in device failures. Exposing a semiconductor wafer to high temperatures, e.g., exceeding 400 degrees C., can also cause the impurities to move about.

For many years, aluminum has been used for the conductive material comprising the interconnect layers of semiconductor devices. Usually an aluminum alloy with a small amount of copper and silicon is used. For example, a prior art aluminum conductive alloy may comprise 2% silicon to prevent the aluminum from diffusing into the surrounding silicon, and 1% copper, to control electro-migration and lead breakage due to Joule's heat.

The semiconductor industry continuously strives to decrease the size and increase the speed of the semiconductor devices located on integrated circuits. To improve the speed, the semiconductor industry is changing from aluminum to copper for metallization layers. Copper has a low resistivity compared to aluminum, resulting in faster current capability when used as a conductive material. Also, the industry is moving towards using low-dielectric constant (k) materials as insulators between conductive leads and the various metallization layers to reduce the overall size of the semiconductor devices.

Using copper as the material for metallization layers has proven problematic for various reasons. One problem with using copper for metallization layers is in the fabrication of MIM capacitors. Once a metallization layer has been applied, when copper is used, the semiconductor wafer cannot be exposed to temperatures higher than around 400° C., because copper may be damaged at temperatures higher than this.

MIM capacitors (MIMcaps) are used to store a charge in a variety of semiconductor devices, such as mixed signal and analog products. MIMcaps typically require a much lower capacitance than deep trench memory capacitors used in dynamic random access memory (DRAM) devices, for example. A MIMcap may have a capacitance requirement of 1 fF/micrometer$^2$, for example.

Prior art MIMcaps are manufactured in the BEOL by forming the bottom capacitive plate in the first or subsequent horizontal metallization layer of a semiconductor wafer. A second mask, pattern and etch step is required to form the top capacitive plate. Alternatively, MIMcaps are formed between horizontal metallization layers in the BEOL in additional horizontal layers, with each plate requiring a separate pattern and etch level.

FIG. 1 shows a prior art horizontal MIMcap having a bottom plate 16 formed within an insulating layer 14. The bottom plate is formed over a workpiece 12 which may include a substrate and other active components, not shown. A capacitor dielectric 18 is deposited over the bottom capacitor plate 16 and insulating layer 14. A top capacitor plate 20 is formed over the capacitor dielectric 18.

A horizontal MIMcap 10 requires a large amount of surface area of a semiconductor wafer. The MIMcap 10 shown is a large flat capacitor positioned parallel to the wafer surface covering a large area of the chip, and does not provide a high area efficiency. Furthermore, manufacturing a horizontal MIMcap 10 requires more than one metallization layer to fabricate the bottom 16 and top 20 plates.

What is needed in the art is a MIM capacitor that utilizes wafer area more efficiently than prior art MIMcaps.

SUMMARY OF THE INVENTION

These problems are generally solved or circumvented by the present invention, which achieves technical advantages as a vertical MIM capacitor formed within a single insulating layer of a semiconductor wafer.

Disclosed is a method of fabricating a MIMcap, comprising forming an insulating layer, forming at least one first conductive line within the insulating layer, and forming at least one trench abutting the first conductive line within the insulating layer. A capacitor dielectric is deposited over the insulating layer, trench, and the first conductive line, and the trench is filled with a conductive material to form a second conductive line.

Also disclosed is a MIMcap, comprising an insulating layer, at least one first conductive line formed within a top portion of the insulating layer, at least one second conductive line disposed proximate the first conductive line within the top portion of the insulating layer, and a capacitor dielectric disposed between at least the first conductive line and the second proximate conductive line.

Further disclosed is a MIM capacitor, comprising an insulating layer disposed over a substrate, a plurality of conductive metal lines formed within the insulating layer, and a capacitor dielectric disposed between the conductive metal lines, wherein two of the conductive metal lines comprise the plates of a vertical MIM capacitor.

Advantages of the invention include providing a vertical MIM capacitor that utilizes wafer area more efficiently than prior art horizontal MIMcaps. The vertical MIMcap described herein may be five times smaller, for example, than horizontal MIMcaps producing the same capacitance. Only one mask level is required, and the structure is self-aligning, relaxing optical lithography critical dimensions and overlay tolerance. The vertical MIMcap may be formed in the same inter-level dielectric as metal leads in a metallization layer. The depth of the conductive lines may be the same as the inter-level dielectric thickness to increase the capacitor area efficiency. A dielectric cap layer may serve as a CMP or etch stop for removing subsequently-deposited conductive materials. The capacitor dielectric of the vertical MIMcap also serves as a cap layer for the metal used to fill the capacitor plate. A vertical double-sided MIMcap and a comb capacitor may be produced in accordance with the present invention.

BRIEF DESCRIPTION OF THE DRAWINGS

The above features of the present invention will be more clearly understood from consideration of the following descriptions in connection with accompanying drawings in which:

FIGS. 2–6 show cross-sectional views of an embodiment of the present invention in various stages of fabrication;

FIG. 7 shows a schematic diagram for a portion of the vertical MIMcap shown in FIG. 6;

FIG. 8 shows a schematic diagram of a double-sided vertical MIMcap illustrated in FIG. 6;

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

Preferred embodiments of the present invention will be described, followed by a discussion of some advantages of the present vertical MIM capacitor.

FIGS. 2–6 show cross-sectional views of a first embodiment of the present invention in various stages of fabrication. A semiconductor wafer 100 includes a workpiece 112, shown in FIG. 2, which may include a semiconductor substrate comprising silicon or other semiconductor materials covered by an insulating layer, for example. Workpiece 112 may also include other active components or circuits formed in the FEOL, not shown.

An insulating layer 122 is deposited over the workpiece 112. The insulating layer 122 preferably comprises an inter-level dielectric (ILD) layer that conductive leads in a metallization layer will be formed within, not shown. Insulating layer 122 preferably comprises silicon dioxide ($SiO_2$) and may alternatively comprise other dielectric materials such as low dielectric constant materials or high dielectric constant materials, for example.

Insulating layer 122 is patterned, etched, and filled with a conductive material to form first conductive lines 124. First conductive lines 124 conductive material preferably comprise a metal such as copper but may alternatively comprise other metals such as aluminum, tungsten, and other conductive materials and combinations thereof, for example. The pattern and fill process may comprise a single damascene or dual-damascene process, for example. The depth of first conductive lines 124 may be the same as other metallization lines of the wafer 100, or the depth of first conductive lines 124 may be the total thickness of a via and wiring line, for example, the total thickness of the insulating layer 122. First conductive lines 124 are preferably spaced apart by a sufficient distance to allow the formation of second conductive lines 136 (of FIG. 6) that will be formed in subsequent steps, to be described further herein.

An optional dielectric cap layer 126 is deposited over insulating layer 122 and first conductive lines 124. Cap layer 126 preferably comprises a thin layer of protective material to prevent diffusion of the metal used for first conductive lines 124 into subsequently deposited insulating layers. For example, if copper is used for the first conductive lines 124 conductive material, copper has a tendency to diffuse into underlying and overlying dielectrics unless a cap layer 126 is used. When the first conductive lines 124 comprise copper, preferably, cap layer 126 comprises a material not comprising an oxide to avoid oxidation of first conductive lines 124. Cap layer 126 may comprise a nitride such as $Si_xN_y$, for example, where x and y are integers of 1 or greater. Also, preferably, metal conductive lines within a metallization layer of the semiconductor wafer are formed simultaneously with the formation of first conductive lines 124, not shown.

Figure 1:
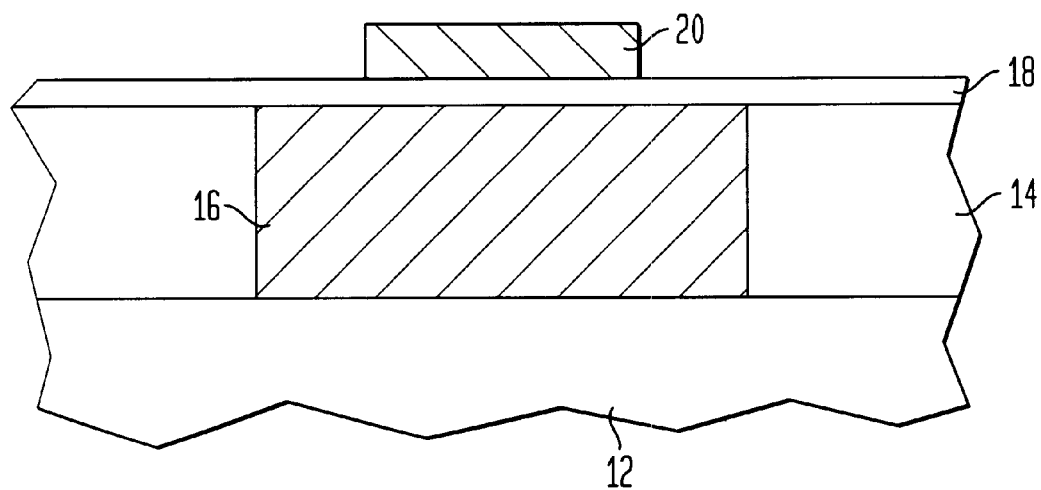
FIG. 1 illustrates a cross-sectional view of a prior art horizontal MIMcap having two metal plates sandwiching a dielectric parallel to the wafer.
Figure 2:
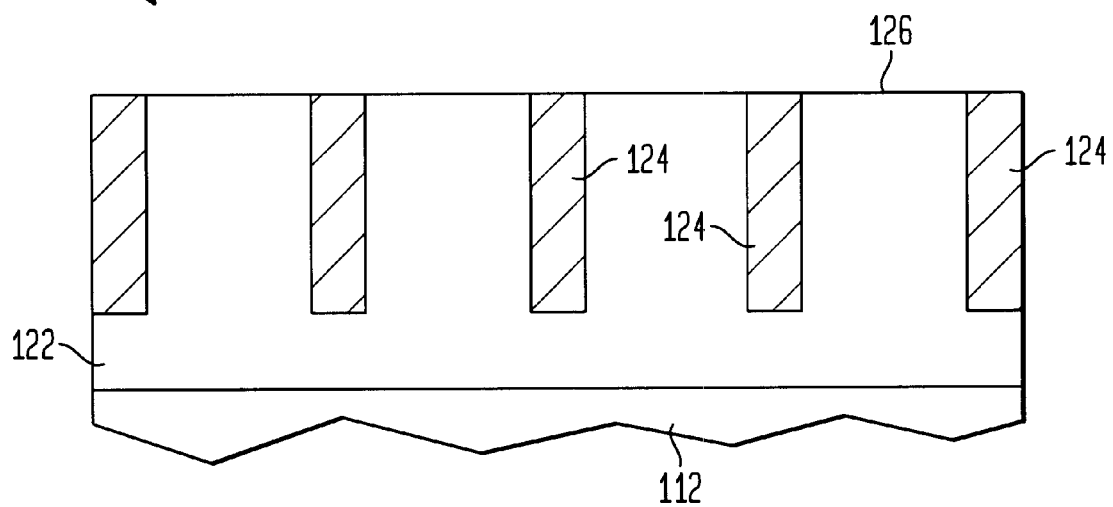
Figure 3:
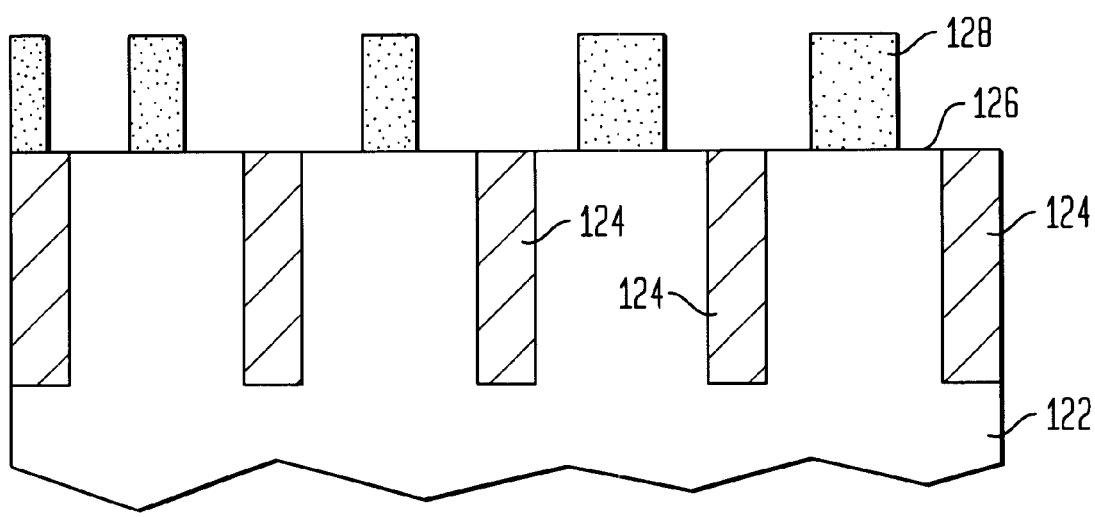

A photoresist 128 is applied to cover cap layer 126, as shown in FIG. 3. Photoresist 128 typically comprises an organic polymer. A lithography mask, not shown, is used to pattern the photoresist 128 to define the shape, size and location for a second set of conductive lines that will be formed, to be described further herein. The critical dimension (CD) of the mask may be 3× of the minimum ground rules, for example, and the overlay is not critical because the width of the second set of conductive lines is not critical. The wafer 100 is exposed, for example, to a UV light, and developed to remove undesired portions of photoresist 128 using either a positive or negative exposure process, leaving the structure shown in FIG. 3 having photoresist portions 128 residing over portions of insulating layer 122.

Figure 4:
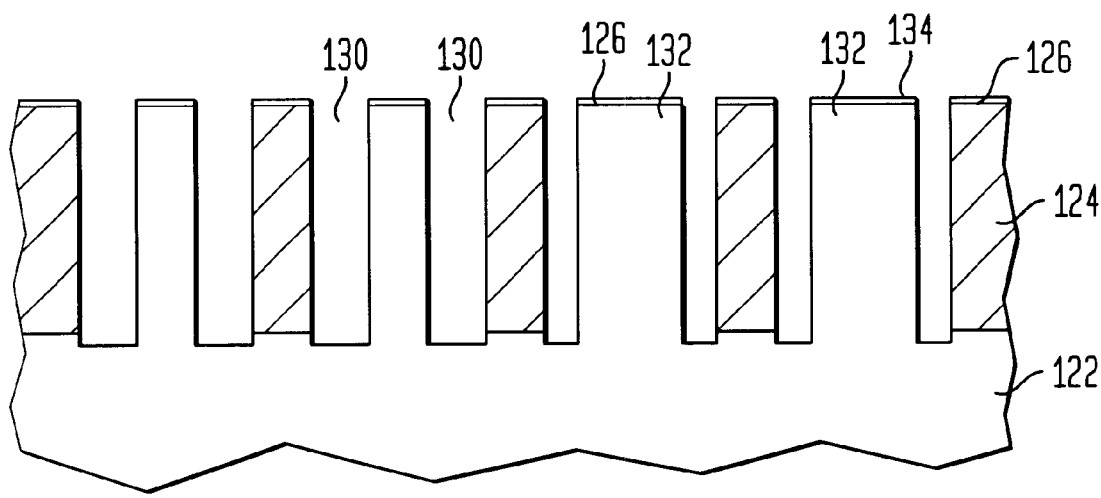

The wafer 100 is etched to create trenches 130 abutting first conductive lines 124, as shown in FIG. 4. Regions 132 of dielectric material in insulating layer 122 may remain residing between some of first conductive lines 124, as shown. The optional cap layer 126 remains on the tops of the remaining insulating layer in regions 132, and also on the tops of first conductive lines 124.

The etch process to form trenches 130 may comprise, for example, a reactive ion etch (RIE) process. Preferably, trenches 130 have about the same depth as first conductive lines 124. Because the RIE etch process is selective to the material used for first conductive lines 124, first conductive lines 124 are substantially unaffected during the etch process. Therefore, the overlay in this step is not critical, and the structure is self-aligned to the first conductive lines 124. Smaller than ground rule features may be formed because the structure is self-aligned. The first conductive lines 124 remain standing along with trenches 130 on either side after the photoresist strip and cleaning, as shown in FIG. 4.

A capacitor dielectric 134 is deposited over first conductive lines 124, regions 132 of dielectric material remaining between first conductive lines 124, and trenches 130. Capacitor dielectric 134 preferably comprises a dielectric such as a film containing $Si_xN_y$ or SiC deposited by plasma-enhanced chemical vapor deposition (PECVD), for example. Alternatively, capacitor dielectric 134 may comprise other dielectric materials, for example. Preferably, capacitor dielectric 134 is relatively thin, e.g., 200 to 700 Angstroms thick, and is conformal. Capacitor dielectric 134 comprises the capacitor dielectric between vertical MIMcap plates, and also may serve as a cap layer for subsequently deposited conductive materials in accordance with the present invention.

A conductive material 136 is deposited over the capacitor dielectric 134, shown in FIG. 5. Conductive material 136 may comprise any conducting material such as a metal, and preferably comprises CVD W or CVD Al. Alternatively, conductive material 136 comprises TiN, Ti, Ta, TaN, TiW, Cu, Si or various combinations thereof, deposited by PVD (physical vapor deposition), CVD or plating, for example.

The excess conductive material 136 is removed from the surface of the wafer 100, for example, by chemical mechanical polishing (CMP) or other etch process, to leave second conductive lines 136 remaining in trenches 130. Cap layer 126 may serve as an etch or CMP stop layer for the second conductive layer 136 removal.

FIG. 6 illustrates a vertical MIMcap structure 144 comprising a plurality of vertical MIM capacitors a-b (140), c-d-e (142) and f-g and others formed in accordance with an embodiment of the present invention. For example, first conductive line 124 shown at "a" and second conductive line 136 shown at "b" comprise two capacitive plates that sandwich a vertical portion 137 of capacitor dielectric 134 to form a vertical MIM capacitor 140. A schematic representation of the vertical MIM capacitor 140 is shown in FIG. 7. A plurality of other vertical MIM capacitors 140 may be formed within a single insulating layer 122 such as the vertical MIMcap shown at "f-g".

Referring again to FIG. 6, multiple first and second conductive lines 124 and 136 shown at "c-d-e" may be placed along the vertical sides of one another to form a double-sided capacitor 142. A schematic representation of the double-sided vertical MIM capacitor 142 is shown in FIG. 8. A plurality of other double-sided vertical MIM capacitors 142 may be formed within a single insulating layer 122.

Figure 9:
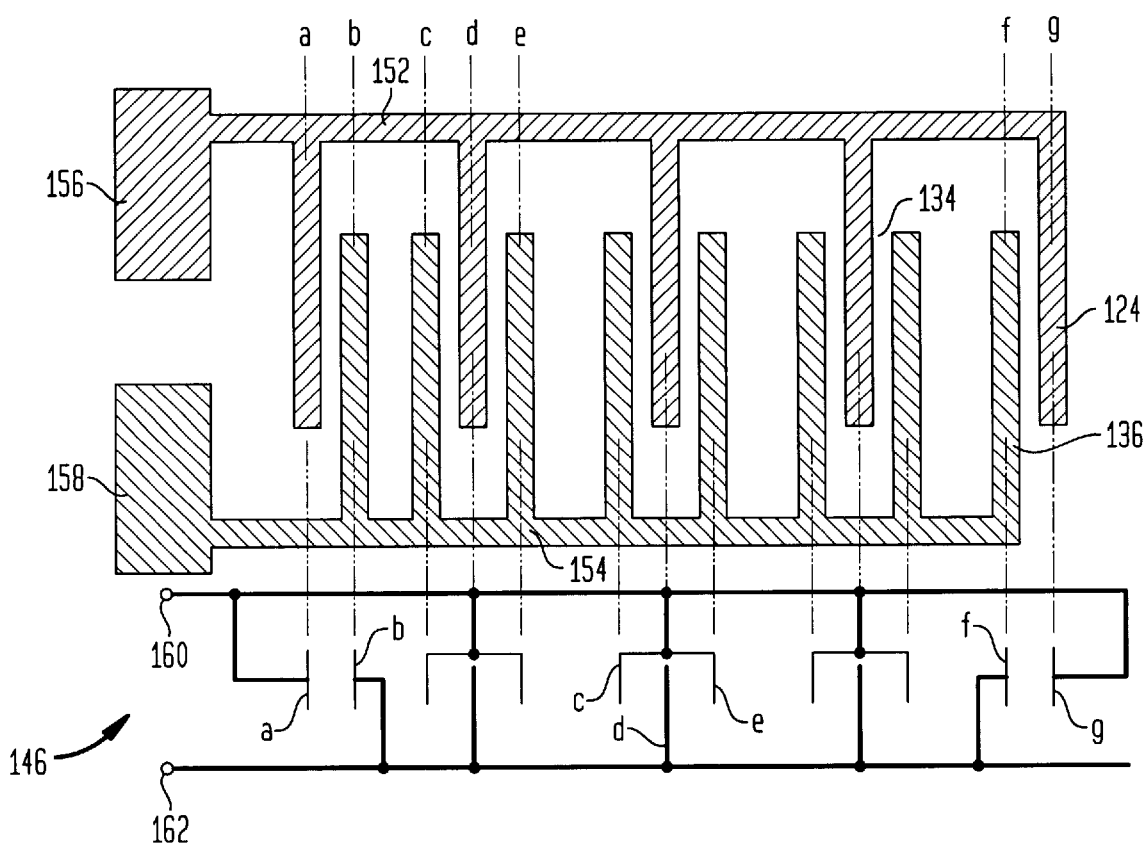
FIG. 9 illustrates a top view and corresponding schematic diagram of a semiconductor wafer having the vertical MIMcap structure shown in FIG. 6, with several of the conductive lines coupled together by an etch run within the same layer.

Conductive lines 124 may be coupled together within the same conductive layer by conductive etch line 152, as shown in a top view in FIG. 9. Similarly, conductive lines 136 may be coupled together in the same conductive layer by conductive etch line 154. Etch lines 152 and 154 may be coupled to pads 156 and 158, respectively. Pads 156 and 158 may be electrically coupled to subsequently or previously-deposited metal layers by vias above or below pads 156/158, for example. Coupling conductive lines 124 and lines 136 together essentially couples the various vertical MIMcaps together in parallel, as shown in the schematic representation at 146 across nodes 160 and 162 in FIG. 9. Because capacitors in parallel add, coupling the vertical MIMcaps in parallel increases the capacitance of the overall vertical MIM capacitor device 144 shown in FIG. 9.

Figure 10:
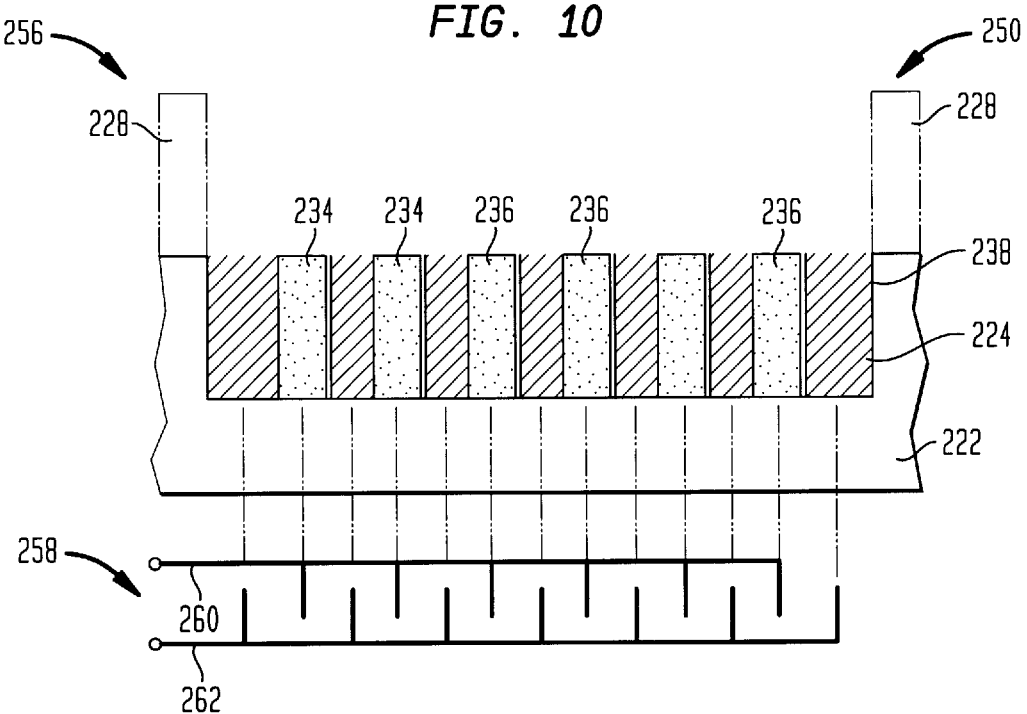
FIG. 10 illustrates a cross-sectional view and schematic representation of an embodiment of the present vertical MIMcap invention having a comb capacitor structure.

Another preferred embodiment of the present invention is shown in FIG. 10, where alternating conductive plates 224/236 are formed with a vertical portion of capacitor dielectric 234 between them. In this embodiment, the lithography pattern exposes more than one conductive line 236, shown in the photoresist pattern 228 in phantom. The first conductive lines 224 are densely packed in this embodiment. All of the insulating layer 222 is removed from between the first conductive lines 224. Capacitor dielectric 234 is deposited over exposed areas of insulating region 222 and over the tops and sidewalls of first conductive lines 224. Second conductive lines 236 are formed between first conductive lines 224 with only a thin layer of capacitor dielectric 234 residing between the first 224 and second 236 conductive lines. The embodiment shown in FIG. 10 results in a relaxed critical dimension and overlay tolerance, and self-alignment of the second conductive lines 236 within the insulating layer 222. All or several of the conductive lines 236 and conductive lines 224, respectively, may be coupled together to form a comb capacitor 256. A schematic representation 258 of the comb capacitor 256 is shown across nodes 260 and 262.

Figure 11:
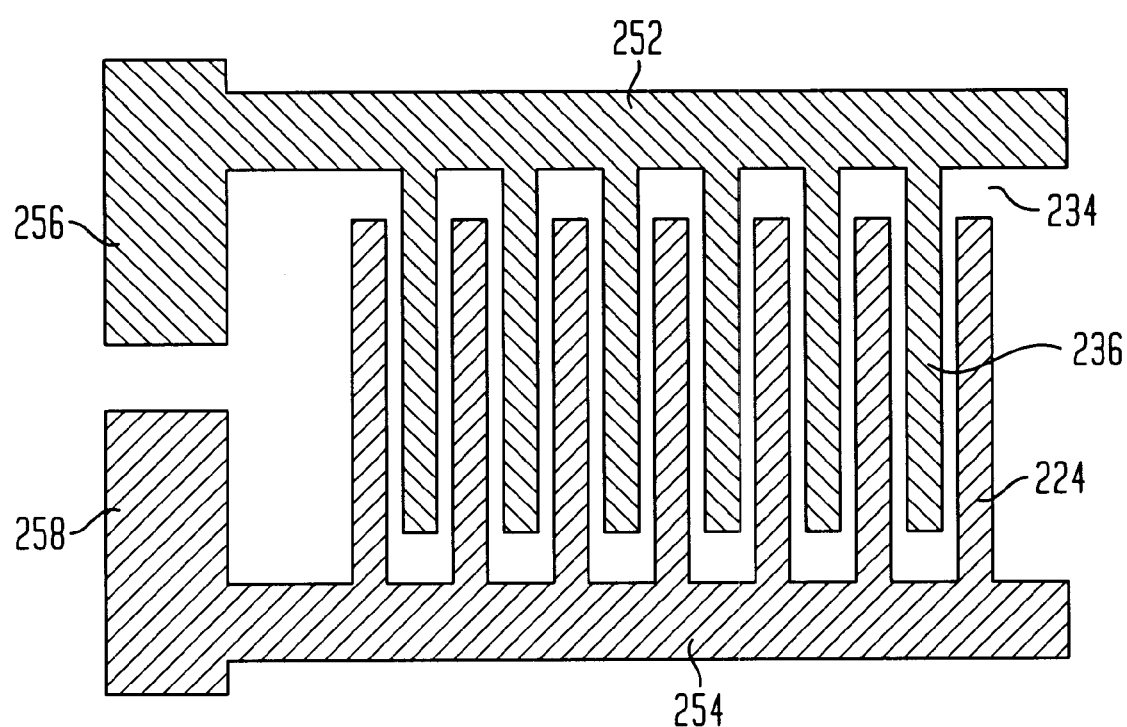
FIG. 11 shows a top view of the vertical MIMcap comb capacitor structure shown in FIG. 10.

The plurality of conductive lines 224/236 may be coupled together in a comb/comb fashion in the same conductive layer, shown in a top view in FIG. 11. Alternatively, the conductive lines 224/236 may be coupled together in a comb/comb fashion in a via layer, not shown. Conductive lines 224 may be coupled together within the same conductive layer by conductive etch line 254, as shown in a top view in FIG. 9. Similarly, conductive lines 236 may be coupled together in the same conductive layer by conductive etch line 252. Etch lines 252 and 254 may be coupled to pads 256 and 258 formed within the same layer, respectively. Pads 256 and 258 may be coupled to subsequently or previously deposited metal layers by vias above or below pads 256/258, (not shown) for example.

The present invention achieves technical advantages as a vertical MIM capacitor 144/256 formed within a single insulating layer 122/222 of a semiconductor wafer. The vertical MIM capacitor 144/256 disclosed herein utilizes wafer surface area more efficiently than prior art horizontal MIMcaps. The vertical MIMcap 144/256 described herein may be five times smaller, for example, than horizontal MIMcaps producing the same capacitance. Only one mask level is required, and the structure 144/256 is self-aligning, relaxing critical dimensions and overlay tolerance. The vertical MIMcap may be formed in the same inter-level dielectric layer 122/222 as metal leads in a metallization layer. The depth of the conductive lines may be the same as the inter-level dielectric thickness, to increase the capacitor area efficiency. The capacitor dielectric 134/234 of the vertical MIMcap 144/256 also serves as a cap layer for the conductive material used to form capacitor plates 136/236. The cap layer 126 may serve as a CMP or etch stop for removing excess conductive material 136. A vertical double-sided MIMcap 142 and a comb capacitor 256 may be produced in accordance with the present invention. Furthermore, a plurality of vertical MIMcaps may be coupled together in parallel to increase the capacitance.

While cross-sectional views of the present vertical MIMcap are shown in FIGS. 2 through 6 and FIG. 10, the MIMcap capacitor plates 124/224 and 136/236 are preferably square or rectangular, and may run lengthwise along the semiconductor wafer by a distance (not shown) according to the capacitance desired. Alternatively, rather than being parallel, the first and second conductive lines 124/224 and 136/236 may form other shapes such as U-shape, circles or zig-zags, for example.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of fabricating a metal-insulator-metal (MIM) capacitor, comprising:
   forming an insulating layer;
   forming at least one first conductive line within a top portion of the insulating layer;
   forming at least one trench abutting the first conductive line within the insulating layer so that the first conductive line has a sidewall;
   depositing a capacitor dielectric over the sidewall of the first conductive line; and
   filling the trench with a conductive material to form a second conductive line, wherein the at least one first conductive line is separated from the second conductive line by a vertical portion of the capacitor dielectric.

2. The method according to claim 1 wherein the first conductive line, capacitor dielectric and the second conductive line form a vertical MIM capacitor.

3. The method according to claim 2 further comprising depositing a cap layer over the insulating layer and the first conductive line.

4. The method according to claim 2 further comprising:
   simultaneously forming interconnect lines in a metallization layer, when forming the first conductive line of the vertical MIM capacitor.

5. The method according to claim 1 wherein forming at least one first conductive line within a top portion of the insulating layer comprises forming a plurality of first conductive lines.

6. The method according to claim 5 wherein forming at least one trench within the insulating layer comprises forming at least one trench between the first conductive lines.

7. The method according to claim 6 wherein filling the trench with a conductive material to form a second conductive line comprises forming at least one second conductive line between the first conductive lines.

8. The method according to claim 7 wherein each first and second conductive line is separated from one another by a vertical portion of capacitor dielectric, wherein any two of the first or second conductive lines disposed around a vertical portion of capacitor dielectric comprise a double-sided vertical MIM capacitor.

9. The method according to claim 1 wherein forming trenches within the insulating layer top portion between the first conductive lines comprises removing substantially all of the insulating layer between the first conductive lines.

10. The method according to claim 9 wherein the first conductive lines and the second conductive lines comprise approximately the same width and depth.

11. The method according to claim 1 wherein forming the first and second conductive line comprise forming metal lines.

12. The method according to claim 1 wherein forming an insulating layer comprises forming an inter-level dielectric.

13. The method according to claim 1, wherein forming the first line comprises forming copper lines and forming the second line comprises forming tungsten lines.

14. A method of fabricating a metal-insulator-metal (MIM) capacitor, comprising:
   forming an insulating layer;
   forming at least one first conductive line within a top portion of the insulating layer;
   forming at least one trench abutting the first conductive line within the insulating layer;
   depositing a capacitor dielectric over the insulating layer, trench, and the first conductive line; and
   filling the trench with a conductive material to form a second conductive line, wherein forming the first line comprises forming copper lines and forming the second line comprises forming tungsten lines.

15. A metal-insulator-metal (MIM) capacitor, comprising:
   an insulating layer;
   at least one first conductive line formed within a top portion of the insulating layer;
   at least one second conductive line disposed proximate the first conductive line within the top portion of the insulating layer; and
   a capacitor dielectric disposed between at least the first conductive line and the second proximate conductive line, wherein the at least one first conductive line is separated from the second conductive line by a vertical portion of the capacitor dielectric.

16. The MIM capacitor according to claim 15 wherein the first conductive line, capacitor dielectric, and the second conductive line form a vertical MIM capacitor.

17. The MIM capacitor according to claim 16 further comprising a cap layer disposed over the insulating layer and the first conductive line.

18. The MIM capacitor according to claim 16 wherein the capacitor dielectric resides beneath the second conductive line.

19. The MIM capacitor according to claim 16 wherein a portion of the insulating layer resides between the first and second conductive lines.

20. The MIM capacitor according to claim 16 wherein substantially no portion of the insulating layer resides between the first and second conductive lines.

21. The MIM capacitor according to claim 16 wherein the first conductive line and the second conductive line comprise approximately the same widths and depths.

22. The MIM capacitor according to claim 16 wherein the capacitor dielectric is 200 to 700 Angstroms thick.

23. The MIM capacitor according to claim 16 wherein the insulating layer comprises an inter-level dielectric, wherein interconnect lines are formed within the inter-level dielectric.

24. The MIM capacitor according to claim 16 wherein each first and second conductive line is separated from one another by a vertical portion of capacitor dielectric.

25. The MIM capacitor according to claim 16 wherein any two of the first or second conductive lines disposed around a vertical portion of capacitor dielectric comprise a double-sided vertical MIM capacitor.

26. The MIM capacitor according to claim 16, wherein the first conductive line comprises copper and the second conductive line comprises tungsten.

27. The MIM capacitor according to claim 16, wherein the first conductive lines are coupled together and the second conductive lines are coupled together to create a comb/comb capacitor.

28. A metal-insulator-metal (MIM) capacitor, comprising:
   an insulating layer;
   at least one first conductive line formed within a top portion of the insulating layer;
   at least one second conductive line disposed proximate the first conductive line within the top portion of the insulating layer; and
   a capacitor dielectric disposed between at least the first conductive line and the second proximate conductive line, wherein the first conductive line, capacitor dielectric, and the second conductive line form a vertical MIM capacitor, wherein the first conductive line comprises copper and the second conductive line comprises tungsten.

29. A metal-insulator-metal (MIM) capacitor, comprising:

an insulating layer;

at least one first conductive line formed within a top portion of the insulating layer;

at least one second conductive line disposed proximate the first conductive line within the top portion of the insulating layer; and a capacitor dielectric disposed between at least the first conductive line and the second proximate conductive line, wherein the first conductive line, capacitor dielectric, and the second conductive line form a vertical MIM capacitor, wherein the first conductive lines are coupled together and the second conductive lines are coupled together to create a comb/comb capacitor.

30. A metal-insulator-metal (MIM) capacitor, comprising:

an insulating layer disposed over a substrate;

a plurality of conductive metal lines formed within the insulating layer; and a capacitor dielectric disposed between the conductive metal lines, wherein the plurality of conductive lines are separated from one another by a vertical portion of capacitor dielectric, wherein two of the conductive metal lines comprise the plates of a vertical MIM capacitor.

31. The MIM capacitor according to claim 30 wherein the capacitor dielectric resides beneath every other conductive metal line.

32. The MIM capacitor according to claim 30 wherein the capacitor dielectric is 200 to 700 Angstroms thick.

33. The MIM capacitor according to claim 30 further comprising a cap layer disposed over the insulating layer and every other conductive metal line.

34. The MIM capacitor according to claim 30 wherein any two adjacent conductive lines disposed around a vertical portion of capacitor dielectric comprise a double-sided vertical MIM capacitor.

35. A method of fabricating a metal-insulator-metal (MIM) capacitor, comprising:

forming at least one first conductive line;

forming at least one trench abutting the first conductive line so that the first conductive line has a sidewall;

depositing a capacitor dielectric over the sidewall of the first conductive line; and filling the trench with a conductive material to form a second conductive line, wherein the first conductive line is separated from the second conductive line by a vertical portion of the capacitor dielectric.

* * * * *